(12) United States Patent
Hirata et al.

(10) Patent No.: US 6,459,947 B1
(45) Date of Patent: Oct. 1, 2002

(54) APPARATUS USING POSITIONAL DATA DETECTED IN A NON-CONTACT MANNER TO TRANSFER A SUBSTANTIALLY RECTANGULAR SUBSTRATE FROM A FIRST POSITION TO A SECOND POSITION

(75) Inventors: Noriyuki Hirata, Yokohama; Syoji Komatsu, Hidaka, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/970,765

(22) Filed: Oct. 5, 2001

Related U.S. Application Data (63) Continuation of application No. 09/034,346, filed on Apr. 4, 1998, now Pat. No. 6,327,512, which is a continuation of application No. 08/649,992, filed on May 17, 1996, now Pat. No. 5,740,059.

(30) Foreign Application Priority Data

May 18, 1995 (JP) .............................. 7-120194

(51) Int. Cl.⁷ .............................................. G06F 19/00
(52) U.S. Cl. ....................... 700/114; 700/115; 700/117; 700/174
(58) Field of Search ................................. 700/114, 115, 700/117, 213, 118–119, 20, 59, 60, 95, 174, 175, 180

(56) References Cited

U.S. PATENT DOCUMENTS

| | | | |
|---|---|---|---|
| 4,511,242 A | 4/1985 | Ashbee et al. ................. 355/14 |
| 4,971,304 A | 11/1990 | Loftus ........................ 271/227 |
| 5,144,116 A | 9/1992 | Harbers, Jr. ................. 235/444 |
| 5,317,351 A | * 5/1994 | Takahara et al. ......... 354/195.1 |
| 5,374,147 A | 12/1994 | Hiroki et al. ................ 414/217 |
| 5,409,348 A | 4/1995 | Suzuki ........................ 414/786 |
| 5,483,138 A | 1/1996 | Shmookler et al. ..... 318/568.16 |
| 5,507,614 A | 4/1996 | Leonov et al. .............. 414/768 |
| 5,645,391 A | 7/1997 | Ohsawa et al. ............. 414/416 |
| 5,740,059 A | 4/1998 | Hirata et al. ................ 700/213 |
| 5,813,819 A | 9/1998 | Ohsawa et al. ............. 414/416 |
| 5,906,469 A | 5/1999 | Oka et al. ................... 414/416 |
| 5,917,601 A | 6/1999 | Shimazaki et al. ......... 356/375 |
| 5,947,796 A | * 9/1999 | Imayama et al. .............. 451/2 |
| 5,995,199 A | 11/1999 | Shinozaki et al. ............ 355/53 |
| 6,032,083 A | 2/2000 | Oosawa ....................... 700/218 |
| 6,079,428 A | * 6/2000 | Anai ........................... 134/172 |
| 6,327,512 B1 | * 12/2001 | Hirata et al. ................ 700/114 |

* cited by examiner

Primary Examiner—Jeffrey Gaffin
Assistant Examiner—Rijue Mai
(74) Attorney, Agent, or Firm—Pillsbury Winthrop (57) ABSTRACT

Transferring apparatus includes a main body defining a take-up position at which a rectangular glass substrate is located and a transfer position spaced apart from the take-up position. A transferring mechanism is arranged between the take-up and transfer positions and provided with a hand for supporting the substrate and transferring the substrate from the take-up position to the transfer position. Two optical sensors are provided on the hand and detect one side of the substrate located at the take-up position. A control section of the apparatus generates positional data in accordance with the detection signals from the sensors. The positional data includes an angle of the one side of the substrate to the hand and a distance between the one side and the hand. The control section controls the operation of the transferring mechanism based on the positional data so as to transfer the substrate from the take-up position and the transfer position and to position it to the transfer position.

5 Claims, 7 Drawing Sheets

APPARATUS USING POSITIONAL DATA DETECTED IN A NON-CONTACT MANNER TO TRANSFER A SUBSTANTIALLY RECTANGULAR SUBSTRATE FROM A FIRST POSITION TO A SECOND POSITION

CROSS-REFERENCE TO RELATED APPLICATIONS

This application is a Continuation of U.S. patent application Ser. No. 09/034,346, filed Apr. 4, 1998, now U.S. Pat. No. 6,327,512, which is a Continuation of U.S. patent application Ser. No. 08/649,992, filed May 17, 1996, now U.S. Pat. No. 5,740,049, which is based upon and claims benefit of priority of Japanese Patent Application No. 7-120194, filed on May 18, 1995, the contents of which are incorporated herein by reference.

BACKGROUND OF THE INVENTION

1. Field of the Invention

The present invention relates to a method of and an apparatus for transferring a substrate from a take-up position to a specified position.

2. Description of the Related Art

In the manufacture of, for example, liquid crystal displays, a plurality of glass substrates used for manufacturing liquid crystal displays are stored in a cassette in a stacked manner and are conveyed to any one of manufacturing units by the cassette.

Each of the manufacturing units has a transferring apparatus and a processing section. The transferring apparatus is designed to transfer the glass substrates, one by one, form the cassette to the processing section. The transferring apparatus comprises a cassette mount region on which the transported cassette is placed so that the glass substrates in the cassette are located at a predetermined take-up position, and transferring means for taking out the glass substrates, one by one, from the cassette on the cassette mount region and transferring it to a specified transfer position which is suitable to the processing section.

Generally, the cassette is large enough to allow each glass substrate to move into and out of the cassette, with its sides not contacting the inner walls of the cassette, even if the transferring means moves sideways while transferring the substrate from the cassette. Thus, each glass substrate in the cassette may be displaced when the cassette is vibrated or inclined while the cassette is being moved from one manufacturing unit to another.

The transferring means moves between two fixed positions, that is, between the take-up position and the transfer position and transfers the glass substrate along a fixed path. Therefore, if a glass substrate is stored in the cassette with being displaced from a predetermined take-up position, this glass substrate is transferred by the transferring means from the cassette to the transfer position while maintaining the displaced state. Accordingly, the transferred glass substrate is located at a position displaced from the specified transfer position.

In order to solve the above-mentioned problem, there is provided a transferring apparatus which has a positioning mechanism for setting glass substrates in a desired position in a cassette placed on the cassette mount region.- The mechanism has two pairs of positioning plates, each pair of which opposes each other. The positioning plates are moved toward the center of the glass substrate from outside so as to force the side edges of the substrate, thereby positioning the substrate in the desired take-up position. By positioning the glass substrate at the take-up position, the substrate can be accurately transferred to the transfer position.

However, the positioning mechanism applies an impact to the glass substrate since the plates mechanically push the four side edges of the glass substrate stored in the cassette. Applied with an impact, the glass substrate may have micro-cracks or may be chipped. Particularly, when the thickness of the glass substrate is smaller than 1 mm, micro-cracks increases.

Here arise two problems. First, dust is generated when micro-cracks are made in the glass substrate or when the glass substrate is chipped. The dust causes decrease in the yield of the manufacturing of the liquid crystal displays. Second, thermal stress concentrates at the micro-cracks or at a chipped part when the glass substrate is heated and cooled in another manufacturing processes, and the substrate may be broken.

If glass substrates repeatedly receive impacts, each time at the transferring apparatus of each manufacturing unit, they may therefore be broken at last, even if they have no micro-cracks or chipped parts at all.

SUMMARY OF THE INVENTION

The present invention has been contrived in consideration of the above circumstances, and its object is to provide a method and apparatus for transferring a substrate from a take-up position to a second position, positioning it in a desired manner at the second position without making micro-cracks in the substrate or chipping the substrate.

According to the present invention, there is provided a method of transferring a rectangular substrate from a first position to a second position by substrate-transferring means, which comprises the steps of: detecting at least two points on one side of the substrate located at the first position by non-contact manner and generating detection signals; generating positional data in accordance with the detection signals, the positional data representing an angle at which the one side of the substrate inclines to the transferring means and a distance for which the one side of the substrate is displaced along a line extending at right angles to the one side; and transferring the substrate from the first position to the second position and to position the substrate at the second position by the transferring means while controlling the transferring means in accordance with the positional data.

According to the present invention, there is provided an apparatus for transferring a rectangular substrate from a first position to a second position, which comprises: transferring means for transferring the substrate from the first position to the second position; detecting means for detecting at least two points on one side of the substrate in non-contact manner, and generating detection signals; and control means for generating positional data in accordance with the detection signals, the positional data representing an angle at which the one side of the substrate inclines to the transferring means and a distance for which the substrate is displaced in a direction extending at right angles to the one side of the substrate, and for controlling the transferring means in accordance with the positional data to transfer the substrate from the first position to the second position and to position the substrate at the second position.

In the method and apparatus according to this invention, the detecting means detects at least two points on one side of the substrate and generating detection signals representing the points detected, and the control means generates the positional data from the detection signals. The positional data represents the angle at which the one side of the substrate inclines and the distance for which the substrate is displaced in a direction extending at right angles to the one side of the substrate. The control means then controls the transferring means in accordance with the positional data. Thus controlled, the transferring means transfers the substrate from the first position to the second position and to position the substrate at the second position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 1 to 8 show a substrate-transferring apparatus according to an embodiment of the present invention, in which:

DETAILED DESCRIPTION OF THE PREFERRED EMBODIMENTS

A method and apparatus for transferring a substrate, according to an embodiment of the present invention, will be described in detail, with reference to the accompanying drawings.

Figure 1:
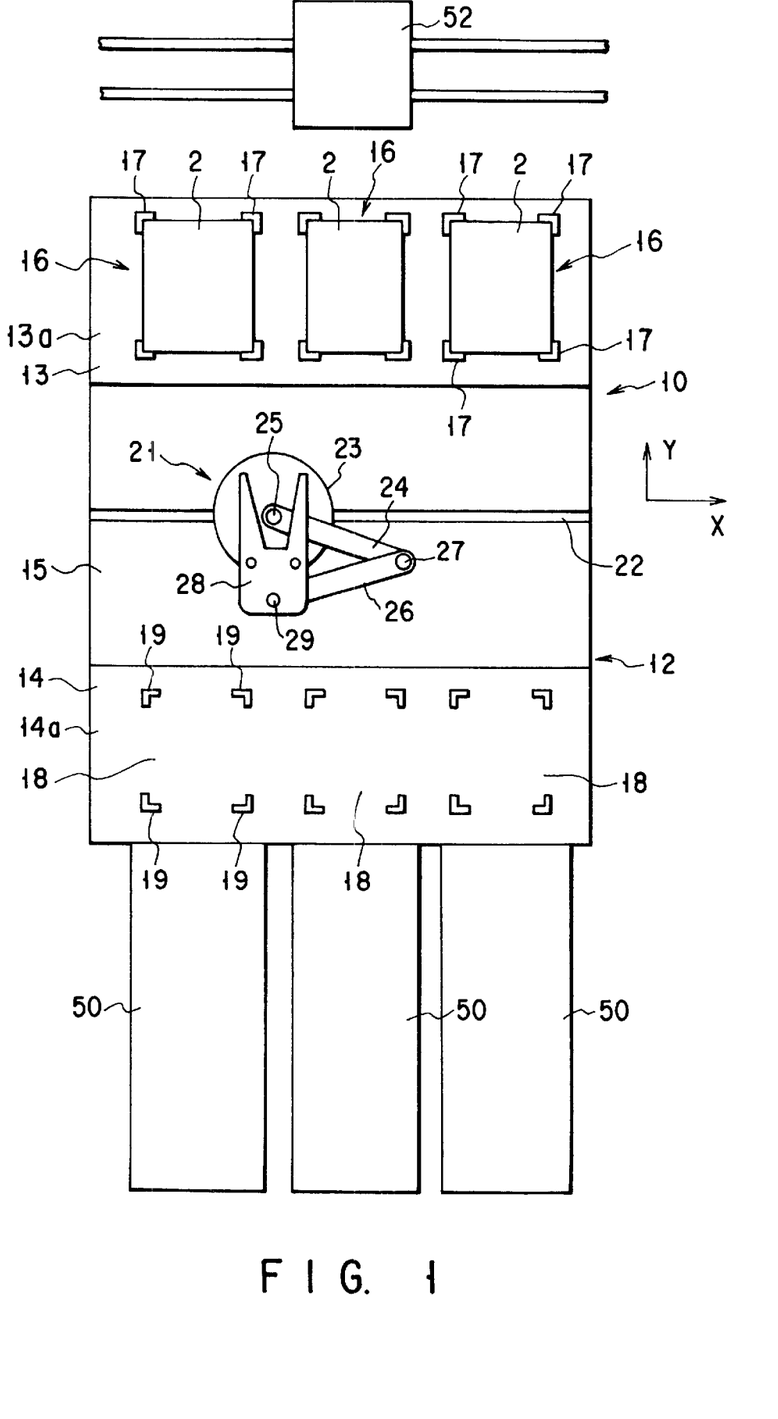
FIG. 1 is a plan view of the substrate-transferring apparatus.
Figure 2:
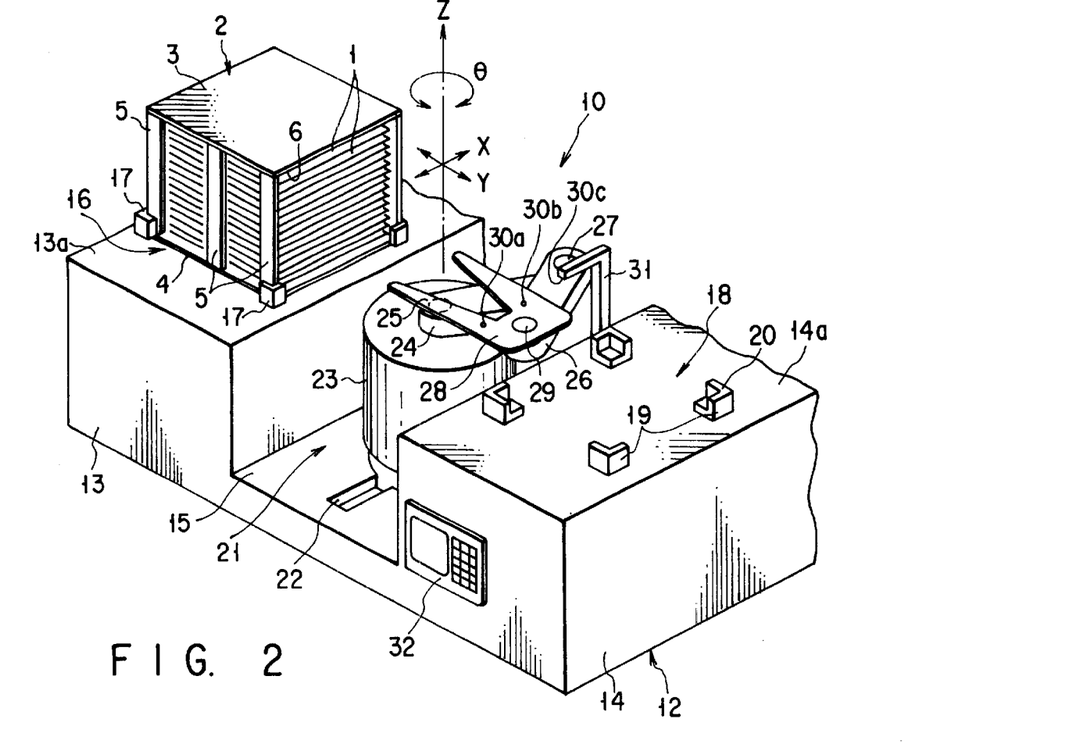
FIG. 2 is a perspective view of the substrate-transferring apparatus.

As shown in FIGS. 1 and 2, a substrate-transferring apparatus 10 has a main body 12. The main body 12 comprises a cassette-mount section 13, a substrate-mount section 14, and a center section 15. The center section 15 is located between the sections 13 and 14 and connecting the sections 13 and 14 together. As seen from FIG. 2, the cassette-mount section 13 and the substrate-mount section 14 are taller than the center section 15, defining a space between them.

The cassette-mount section 13 has an upper surface 13a serving as a cassette-mount surface. The surface 13a is flat and horizontal, for supporting cassettes 2 each containing a plurality of substrates 1. The substrate-mount section 14 has an upper surface 14a serving as a substrate-mount surface. The surface 14a is flat and horizontal, for supporting substrates 1 transferred from any cassette 2 mounted on the cassette-mount surface 13a.

The apparatus 10 further comprises a substrate-transferring mechanism 21. The mechanism 21 is provided on the center section 15 of the main body 12 and, hence, in the space between the sections 13 and 14. It is designed to transfer the substrates 1, one by one, from any cassette 2 mounted on the upper surface 13a onto the upper surface 14a.

Figure 3:
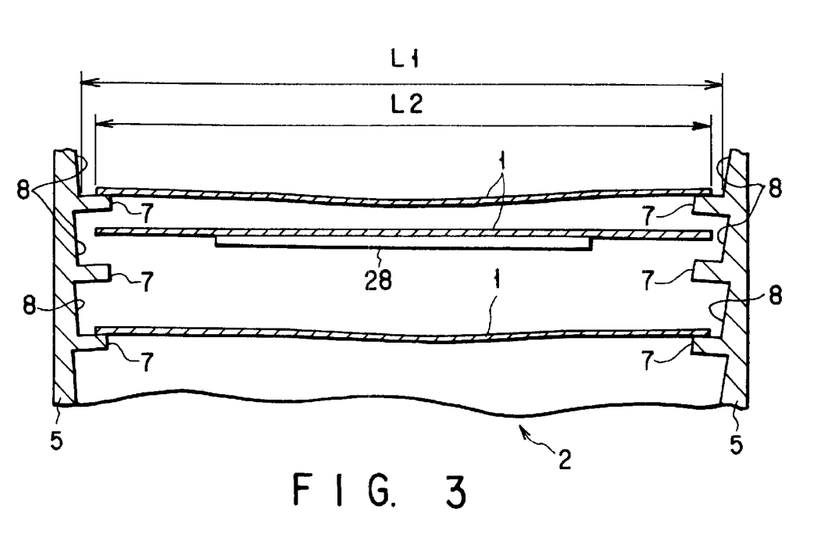
FIG. 3 is a sectional view showing a part of a cassette to be mounted on the substrate-transferring apparatus.

As can be understood from FIGS. 2 and 3, the substrates 1 contained in any cassette 2 mounted on the upper surface 13a are, for example, glass substrates for use in liquid crystal displays. The substrates 1 are made of non-alkali silicate glass and is rectangular, 500 mm long, 400 wide and 0.7 mm thick.

The cassette 2 is a box-shaped container and comprised of a top plate 3, a bottom plate 4, side strips 5, and back strips (not shown). The side and back strips extend vertically, connecting the top plate 3 and the bottom plates 4 together. The cassette 2 has an opening 6 on the front, through which substrates 1 can be moved into and from the inside. As shown in FIG. 3, a plurality of projections 7 extend inwards from the inner surface of each side strip 5 with predetermined intervals, e.g. 18 mm, in the vertical direction. In the cassette 2, the substrates 1 are horizontally supported one above another, each having its sides resting on the projections 7 which are located at the same level.

The inner surface 8 of each strip 5 defining the left side of the cassette 2 are spaced from the inner surface 8 of the corresponding strip 5 defining the right side thereof by a distance L1. This distance L1 is measured at a position near the upper surface of the projection 7. The distance L1 is longer than the width L2 of the substrates 1, i.e., L2>L1. A clearance can therefore be provided between the inner surface 8 of any side strip 5 and either side of each substrate 1. This prevents the side edges of the substrate 1 from contacting the inner surfaces 8 of the side strips 5 as the substrate 1 is moved into and from the cassette 2. The distance L1 is, for example, 410 mm in the case where the substrates 1 have a width of 400 mm. In this case, the clearance between the inner surface 8 of each side strip 5 and either side edge of each substrate 1 ranges from 5 mm to 10 mm. Hence, error of positioning the substrates 1 in the cassette 2 is a range of ±1 mm.

That part of the inner surface 8 of each side strip 5 which extends between any two adjacent projections 7 are in inclined such that the distance between the left and right inner surfaces increases from the lower projection 7 toward the upper projection 7. This prevents the substrates 1 from contacting the inner surfaces 8 of the side strips 5 even if the substrate-transferring mechanism 21 moves sideways while it is transferring the substrates 1, one by one, from the cassette 2 onto the substrate-mount surface 14a, and vice versa.

As illustrated in FIGS. 1 and 2, a plurality of, for example, three take-up positions 16 are defined on the upper surface 13a of the cassette-mount section 13 and aligned in a X-axis. Each of the take-up positions 16 is defined by four L-shaped positioning members 17 fixed to the upper surface 13a. The cassette 1 is positioned at any one of the take-up positions 16 while the four lower corners are fitted with the positioning members 17.

As shown in FIG. 1, on the side of the cassette mount section 13 is provided a cassette-transfer robot 52 capable of moving along the cassette-mount section 13 and automatically transferring the cassettes 2 to the take-up positions 16 and therefrom, one by one.

Three transfer positions 18 are defined on the substrate-mount surface 14a of the substrate-mount section 14 and aligned in a direction parallel to the X-axis. Four support members 19 are fixed to the upper surface 14a at each of the transfer positions 18. The four support members 19 have L-shaped mount surfaces 20 which are horizontal and on which four corner portions of a transferred substrate 1 are mounted, respectively.

Each take-up position 16 is aligned with the corresponding transfer position 18 so that a line passing through the centers of the take-up and transfer positions extends in a direction perpendicular to the X-axis, that is in a Y-axis.

As shown in FIG. 1, three process devices 50 constituting manufacturing units are arranged along that side of the substrate-mount section 14 which faces away from the cassette-mount section 13. They are a CVD (Chemical Vapor Deposition) device, a washing device, and a similar device, for processing the substrates 1 to manufacture a plurality of liquid display panels.

Figure 4:
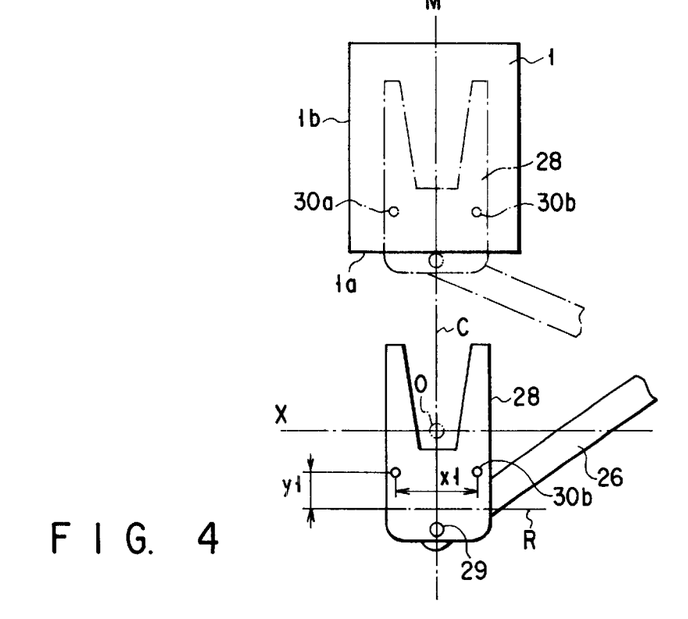
FIG. 4 is a plan view illustrating a part of the transferring mechanism incorporated in the apparatus.

The transferring mechanism 21 serving as transferring means comprises a hand 28 serving as a support member for supporting a substrate 1. As shown in FIGS. 1, 2, and 4, the hand 28 is movable in a horizontal plane along two lines, both passing a center axis O of the mechanism 21. To be more precise, it can move along the X axis and a moving axis M extending straight between the take-up position 16 and the transfer position 18 which oppose each other. Furthermore, the hand 28 is movable up and down along a Z axis coaxial with the center axis O and rotatable around the Z axis.

More specifically, the transferring mechanism 21 comprises a drive unit 23 which is provided on the center section 15 of the main body 12. The drive unit is movable along a straight groove 22 cut in the upper surface of the center section 15 and extending in parallel to the X-axis. The drive unit 23 serving as drive means has a rotational shaft 25 which is movable vertically along the Z axis and rotatable around the Z axis, in the direction of the arrow θ as shown in FIG. 1. Namely, the rotational shaft 25 extends through the center axis O of the transferring mechanism 21. Further, the drive unit 23 itself is rotatable around the Z axis.

Connected to the rotational shaft 25 is one end of a first arm 24. The first arm 24 is therefore rotatable when the shaft 25 is rotated. The other end of the first arm 24 is coupled to one end of a second arm 26 by a pin 27 so that the second arm 26 is rotatable around the pin 27. The hand 28 is coupled by a pin 29 to the other end of the second arm 26 so as to be rotatable around the pin 29. The first arm 24 and the second arm 26 constitute a link, which functions as moving means. The second arm 26 rotates through a prescribed angle in interlock with the rotation of the first arm 24.

The hand 28 is formed of a thin plate extending horizontally. It has a base portion and two arm portions extending from the base portion. The base portion is connected to the pin 29, which in turn is connected to the end of the second arm 26. The hand 28 has a center line C and connected to the second arm 26 so that the center axis C coincides with the moving axis M which extends straight passing through the axis of the pin 29 and the center axis O of the mechanism 21.

The hand 28 is moved along the X axis as the drive unit 23 moves along the groove 22. It is moved along the Z axis as the rotational shaft 25 is moved vertically along the Z axis, moving both arms 24 and 25 up and down. Further, the hand 28 is moved along the moving axis M as the first and second arms 24 and 26 are rotated by the rotational shaft 25, with its center line C kept in alignment with the moving axis M. Further, the hand 28 rotates around the center axis O of the mechanism 21 when the drive unit 23 rotates around the axis O together with the first and second arms 24 and 26.

First and second non-contact sensors 30a and 30b are mounted on the base portion of the hand 28, for detecting two points on that side of each substrate 1 which is located near the opening 6 of the cassette 2. Both sensors 30a and 30b, which constitute first detecting means, are reflection sensors, each having a beam emitting/receiving surface turned upwards. The sensors 30a and 30b emits an infrared beam each, which is reflected from the glass substrates 1, not penetrating them. The first and second sensors 30a and 30b are placed symmetrically with respect to the center line C (the line passing through the axis of the pin 29 and the center axis O of the mechanism 21). In other words, the sensors 30a and 30b are arranged in a line which intersects at right angles with the center line C of the hand 28. They are spaced from each other by a distance x1 of, for example, 200 mm.

As seen from FIG. 4, a reference mount line R is defined, extending parallel to the X axis and spaced by distance y1 of 100 mm from the first and second sensors 30a and 30b toward the proximal end of the hand 28. A substrate 1 is supported on the hand 28, with its side 1a aligned with the reference mount line R.

As shown in FIG. 2, a third sensor 30c is located near the transfer position 18, for detecting one point on the side 1b of each substrate 1, which is perpendicular to the side 1a thereof. The third sensor 30c is fastened to the free end of an L-shaped arm 31 which stands upright on the substrate-mount section 14. The third sensor 30c has a beam emitting/receiving surface turned downwards. The sensor 30c is also a non-contact one, more precisely a reflection sensor emitting an infrared beam, which is reflected from the glass substrates 1, not penetrating them.

Each of the sensors 30a, 30b and 30c has an focusing lens (not shown) whose focal distance is about 8 mm. Thus, the sensors 30a, 30b and 30c are most sensitive when they are spaced by 8 mm from the surface of a substrate 1. They are adjusted so as to have a detection accuracy in a range of ±0.2 mm if they are located a distance 8.0 mm from the surface of the substrate 1.

A control panel 32 is provided on one side of the substrate-mount section 14 as illustrated in FIG. 1. The panel 32 has input keys and a display.

Figure 5:
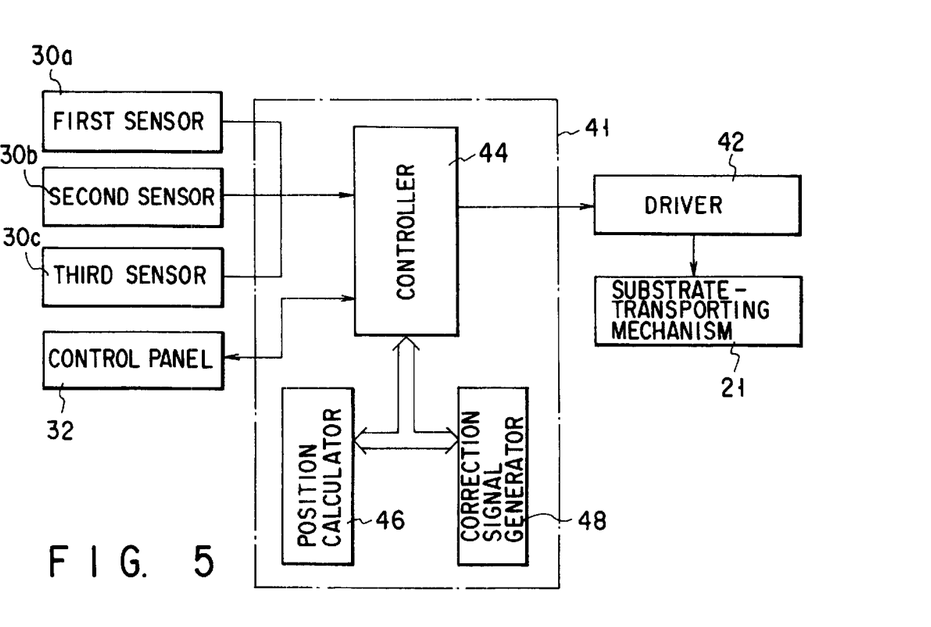
FIG. 5 is a block diagram of the substrate-transferring apparatus.

As shown in FIG. 5, the control panel 32 is connected to a control section 41 which operates as control means and adjusting means. Also connected to the control section 41 is a driver 42 for driving the drive unit 23. The control section 41 comprises a main controller 44, a position calculator 46 and a correction signal generator 48. The main controller 44 controls the substrate-transferring mechanism 21. The position calculator 46 calculates the position the substrate 1 has with respect to the hand 28, based of the detection signals output from the three sensors 30a, 30b and 30c and the operating condition of the substrate-transferring mechanism 21. The correction signal generator 48 generates a correction signal based on the calculated position. The correction signal will be used to correct the transferring operation of the mechanism 21 in a desired manner.

How the apparatus 10 described above transfers the substrates 1 will now be explained, with reference to FIGS. 6A to 6G, FIGS. 7A to 7C, and FIG. 8.

Assume that the cassette transfer robot 52 has transferred a cassette 2 to the take-up position 16 and that glass substrates 1 are contained in the cassette 2, located one above another. It is also assumed that the hand 28 of the transferring mechanism 21 is set in an initial position.

Figure 6A:
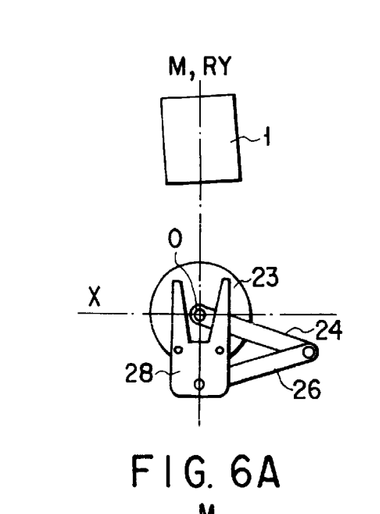
FIGS. 6A to 6G are plan views of the transferring mechanism, schematically explaining how the transferring mechanism transfers a substrate.
Figure 7A:
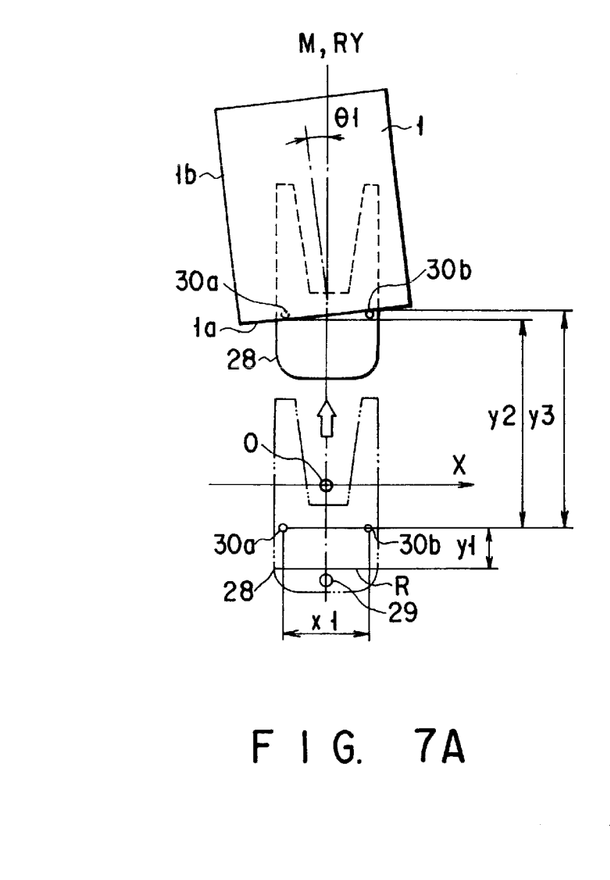
FIGS. 7A to 7C are plan views showing the hand of the transferring mechanism, schematically explaining how the hand is moved to transfer a substrate.

As shown in FIGS. 6A and 7A, in the initial position, the transferring mechanism 21 is positioned, with its center axis O set on not only the X axis but also a reference axis RY extending in parallel to the Y axis through the centers of the take-up position 16 and the transfer position 18 which are oppose each other. In this condition, the hand 28 is positioned so that its center line C and the moving axis M are aligned with the reference axis RY.

Figure 8:
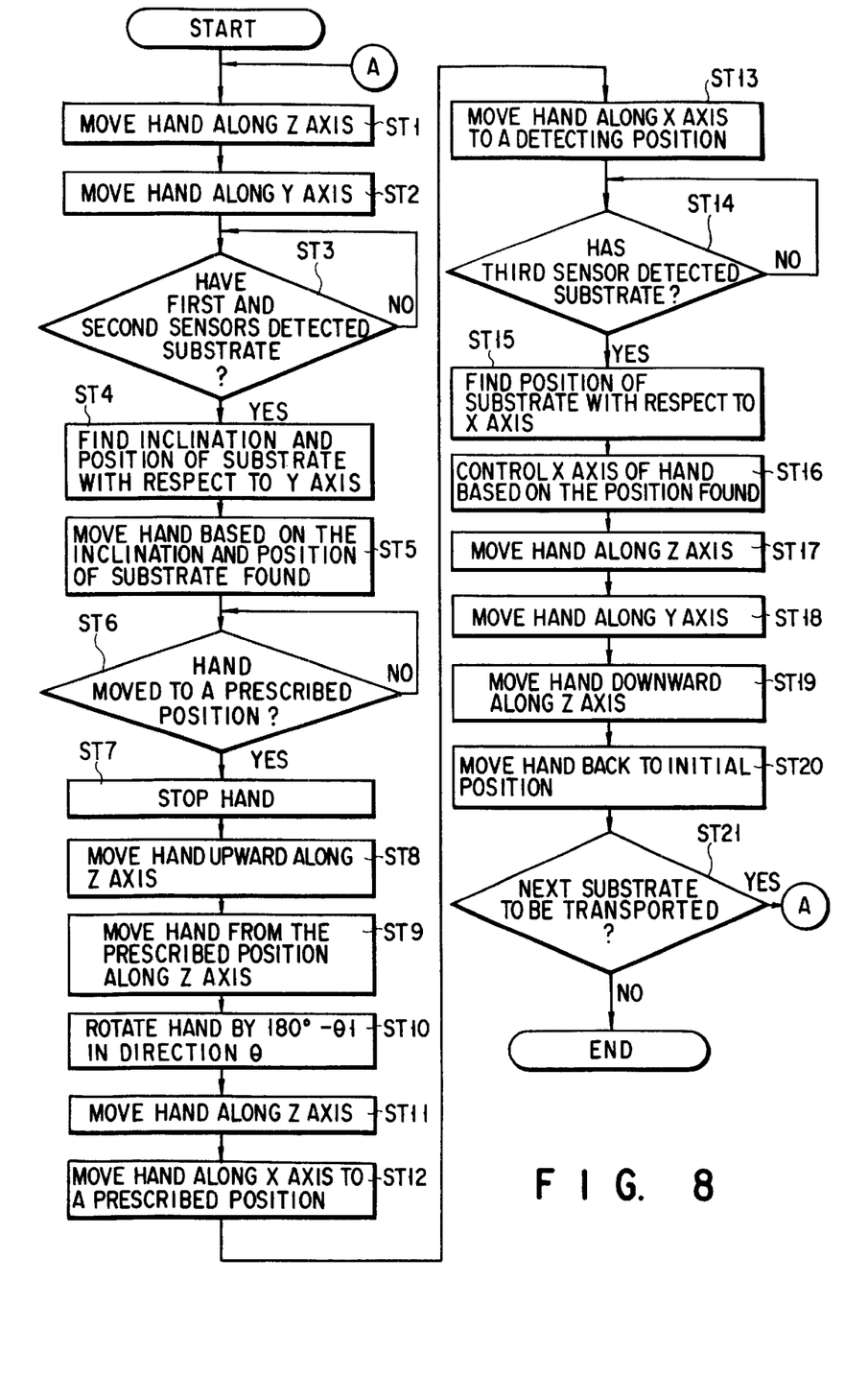
FIG. 8 is a flow chart for explaining the operation of the substrate-transferring apparatus.

Upon transferring substrates 1 the transferring mechanism 21 is driven under the control of the control section 41 to transfer a substrate 1 from the cassette 2. In first, the drive unit 23 vertically moves the hand 28 along the Z axis to a level slightly lower than the level at which the substrate 1 to be transferred is located in the cassette 2, so that the both sensors 30a and 30b on the hand 28 may be spaced by 8 mm from the level of the lower surface of the substrate 1 (Step ST1).

Figure 6B:
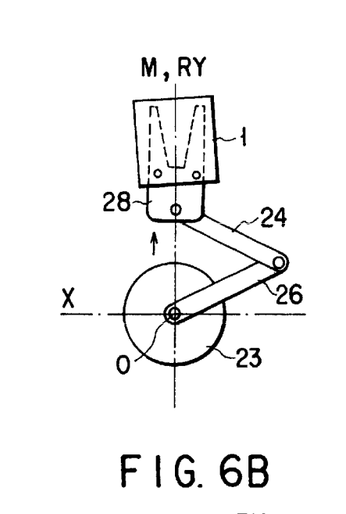

Then, as shown in FIGS. 6B and 7A, the hand 28 is moved toward the take-up position 16, along the reference axis RY, until it insert into the gap between the substrate 1 and the next lower substrate contained in the cassette 2 or the bottom plate 4 of the cassette 2 (Step ST2). When the first and second sensors 30a and 30b move across the side 1a of the substrate 1 as the hand 28 enters the cassette 2, they detects the side a and generates a detection signal each (Step ST3).

If neither the first sensor 30a nor the second sensor 30b generates a detection signal even though the hand 28 has moved a predetermined distance into the cassette 2, the control section 41 determines that the cassette 2 does not contain the substrate 1 to be transferred. In this case, the control section 41 causes the driver 42 to drive the drive unit 23, which moves the hand 28 from the cassette 2 back to the initial position. If only one of the first and second sensors 30a and 30b generates a detection signal, the control section 41 determines that a part of the substrate 1 is missing. In this case, too, the control section 41 makes the driver 42 to drive the drive unit 23, which brings the hand 28 back to the initial position. Thus, the sensors 30a and 30b cooperate, not only to detect whether the cassette 2 contains the very substrate 1 to be transferred from the cassette 2, but also whether the substrate 1 has a missing part. If it is found that the cassette 2 does not contain the substrate 1 or the substrate 1 has a missing part, measures will be taken to remedy this undesired state. Not directly related to the present invention, these measures are described here.

In the control section 41, the calculator 46 calculates a distance y2 the hand 28 is moved from the initial position until the first sensor 30a detects the side 1a of the substrate 1, from the time the first sensor 30a outputs a detection signal. Also, the calculator 46 calculates a distance y3 the hand 28 is moved from the initial position until the second sensor 30b detects the side 1a of the substrate 1, from the time the second sensor 30b outputs a detection signal.

The control section 41 calculates the inclination of the substrate 1, i.e., the angle $\theta 1$ (FIG. 7A) at which the center line of the substrate 1 inclines to the reference axis RY, and also the position of the side 1a of the substrate 1 in a direction along the reference line RY. Based on the data item (referred as first positional data) representing the angle and position of the side 1a of the substrate 1, the control section 41 then obtains the direction and distance in and for which the hand 28 must be moved to have its reference-positioning line R aligned with the side 1a of the substrate 1 (Step ST4).

Assume that the first sensor 30a outputs a detection signal when the hand 28 is moved by 500 mm along the reference axis RY (y2=500 mm), and that the second sensor 30b outputs a detection signal when the hand 28 is moved by 504 mm along the reference axis RY (y3=504 mm). Then, the angle $\theta 1$ the controller 42 calculates is 1.146°, provided that the distance x1 between the sensors 30a and 30b is 200 mm. Namely, tan $\theta 1=(504-500)/200$.

Figure 6C:
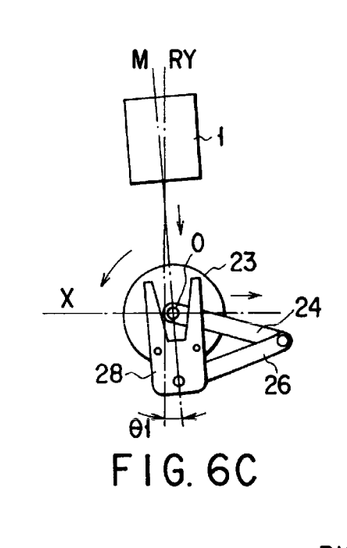
Figure 7B:
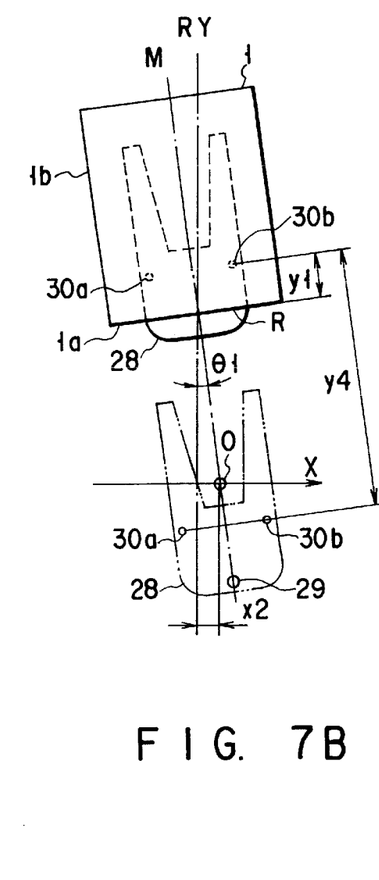

Thereafter, the control section 41 drives the drive unit 23 so as to move the hand 28 back to the initial position. The control section 41 then operates the transferring mechanism 21 such that the hand 28 is set at a prescribed relative position with respect to the substrate 1, as is shown in FIGS. 6C and 7B. That is, the drive unit 32 is moved to the right along the X axis for a distance x2 of 10.04 mm (=tan $\theta 1 \times (504+500)/200$) and rotated counterclockwise around the center axis O through the angle $\theta 1$ of 1.146°. The line extending through the first and second sensors 30a and 30b is thereby made to extend parallel to the side 1a of the substrate 1. As a result, the center line C and moving axis M of the hand 28 are inclined in the same way as the substrate 1.

Next, the control section 41 calculates a distance y4 the hand 28 is moved along the moving axis M. The distance y4 is 602.1 mm since the reference positioning line R of the hand 28 is spaced by a distance y1 of 100 mm from the line connecting the first and second sensors 30a and 30b. It should be noted that y4={(504+500)/2}/cos $\theta 1+100$.

The control section 41 corrects the data item representing the position of the moving axis M and the data item representing the rotated position of the hand, in accordance with the results of calculation. Based on the data items corrected, the section 41 then controls the transferring mechanism 21 (Step ST5). To be more specific, the section 41 corrects these data items based on the assumption that the center axis O of the transferring mechanism 21 has moved to the right along the X axis for a distance x2 of 10.04 mm, that the moving axis M has rotated counterclockwise with respect to the reference axis RY around the center axis O through the angle $\theta 1$ of 1.146°, and that the hand 28 should be moved along the moving axis M for a distance y4 of 602.1 mm, and then controls the hand 28 in accordance with the data items thus corrected.

Figure 6D:
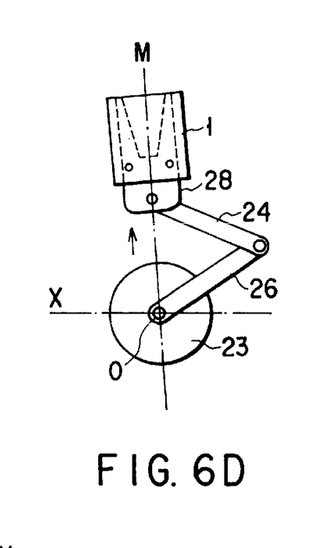

By controlling the transferring mechanism 21 based on the corrected data, the hand 28 is moved and stopped at a predetermined position relative to the take-up position 16, where it can receive the substrate 1, as shown in FIGS. 6D and 7B (Steps ST6 and ST7). At this position, the hand 28 has its center line C extending parallel to the side 1b of the substrate 1 and its reference positioning line R being aligned with the side 1a of the substrate 1.

The distances y2 and y3 detected from the output signals of the first and second sensors 30a and 30b may be found equal in Step ST3. This means that the substrate 1 assumes a desired position, with its side 1a extending at right angles to the center line C of the hand 28. In this case, the substrate 1 is considered to be inclined by 0°, and the control section 41 causes the driver 42 to move the hand 28 along the reference axis RY to the prescribed position where it receives the substrate 1.

In the above steps, after returning the hand 28 to the initial position, the position of the hand is corrected. However, the position of the hand 28 relative to the substrate 1 may be corrected at the inserted position shown in FIGS. 6B and 7A, without returning the hand to the initial position.

Figure 6E:
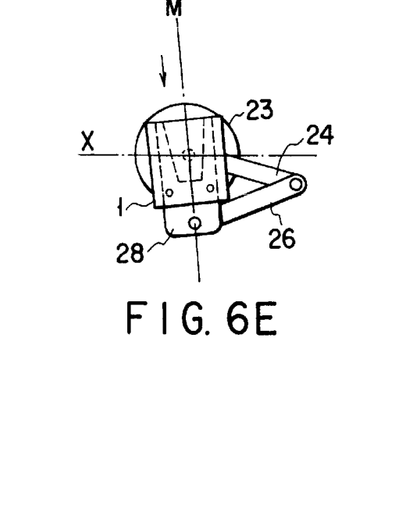

Then, the drive unit 23 moves the hand 28 upward along X axis for a predetermined distance. The hand 28 supports the substrate 1 and lifts it up to a prescribed level from the projections 7 (Step ST8). The drive unit 23 moves the hand 28 to a position right above the drive unit, as is shown in FIG. 6E, whereby the substrate 1 is taken out from the cassette 2 (Step ST9). At this time, the substrate 1 can be taken out of the cassette 2 without contacting the inner surfaces 8 of the side strips 5 of the cassette 2, provided that the hand 28 moves sideways while it is transferring the substrates 1, but for a distance not exceeding 0.5 mm. This is because that part of the inner surface 8 of each side strip 5 which extends between any two adjacent projections 7 are in inclined such that the distance between the opposing inner surfaces increases from the lower projection 7 toward the upper projection 7.

Figure 6F:
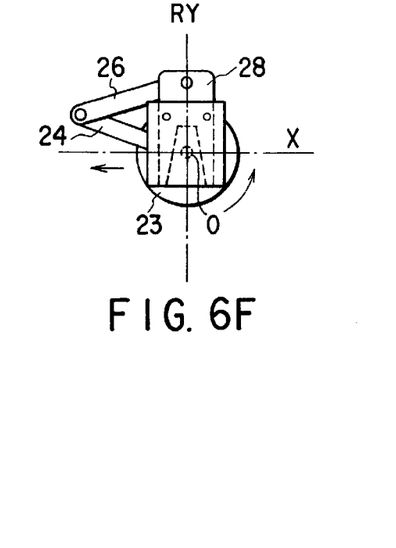
Figure 7C:
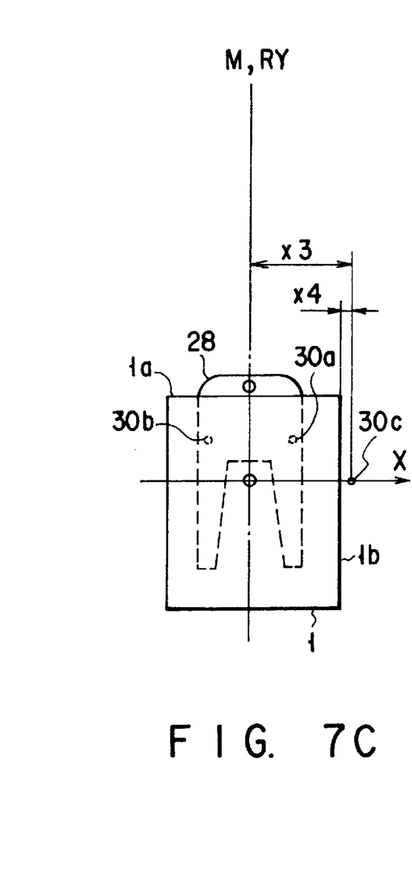

Thereafter, as shown in FIGS. 6F and 7C, the control section 41 causes the driver 42 to rotate the drive unit 23 counterclockwise around the center axis O through 180°+θ1, together with the arms 24 and 26 and the hand 28. The substrate 1 supported on the hand 28 is thereby rotated through the same angle, facing the transferred position 18 (Step ST10). At the same time, the hand 28 is moved upwards along the Z axis until the distance between the upper surface of the supported substrate 1 and the level of the third sensor 30c decreases to 8 mm (Step ST11). The drive unit 23 is moved to the left for the distance x2 along the X axis (Step ST12).

The moving axis M and the center line C of the hand 28 are thereby set in alignment with the reference axis RY. In this condition, the center line C is located at a prescribed distance x3 of, for example, 210 mm, from the third sensor 30c.

Next, the control section 41 controls the driver 42 so that the drive unit 23 moves the hand 28 along the X axis toward the third sensor 30c by a distance of 20 mm. The third sensor 30c detects the side 1b of the substrate 1, which extends at right angles to the side 1a (Steps ST13 and ST14).

As indicated above, the clearance between the inner surface 8 of each side strip 5 of the cassette 2 and either side of the substrate ranges from 5 mm to 10 mm. Even if the center line of the substrate 1 is displaced from the center line C of the hand 28 by a maximum distance of 10 mm, the third sensor 30c can reliably detect the side 1b of the substrate only if the hand 28 is moved by 20 mm.

The third sensor 30c may not detects the side 1b of the substrate 1 even if the hand 28 is moved by 30 mm. If this happens, the control section 41 determines that substrate 1 has been damaged at the side 1b or 1 has fallen from the projections 7 protruding from the inner surfaces 8 of the side strips 5, and generates an error signal. In response to the error signal, some measures are taken to remove the substrate. The If this is the case, the control section 41 generates an alarm signal. In response to the alarm signal, measures will be taken to remedy this undesired state. Not directly related to the present invention, these measures are described here.

In the control section 41, the calculator 46 obtains the distance y3 the hand 28 is moved along the X axis until the third sensor 30c detects the side 1b of the substrate 1 and generates a detection signal. From the distance y3 obtained, the calculator 46 calculates how much the substrate 1 has been displaced along the X axis from the center line C of the hand 28 (Step ST15). The displacement thus calculated will be used as data item (referred as second positional data) representing the position of the side 1b of the substrate 1.

More specifically, if the center line of the substrate 1 coincides with the center line C of the hand 28, the band 28 must have been moved along the X axis for a distance x4 of 10 mm (=210−200). Thus, if the third sensor 30c generates a detection signal the moment the hand 28 is moved for 5 mm along the X axis, it will be known that the substrate 1 has been displaced to the right (in FIG. 7C) by 5 mm (=10−5). In this case, the control section 41 controls the driver 42 such that the drive unit 23 moves to the left for 5 mm (in FIG. 7C) together with the hand 28. As a result, the center line of the substrate 1 coincides with the reference axis RY, whereby the substrate 1 is set at a prescribed relative position with respect to the transfer position 18 (Step ST16).

Figure 6G:
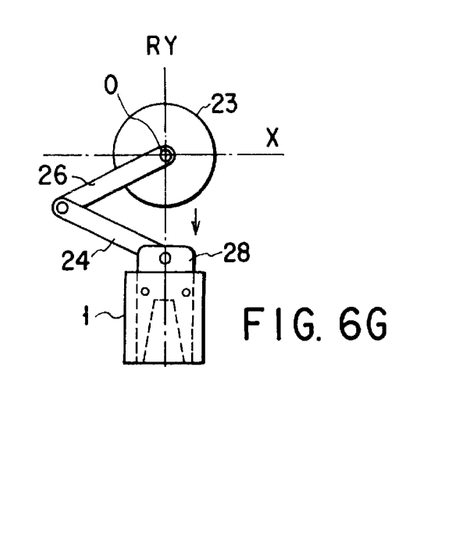

Then, the hand 28 is moved along the Z axis until a predetermined clearance is provided between the substrate 1 and the mount surface 20 of any L-shaped support member 19 (Step ST17). As shown in FIG. 6G, the hand 28 is moved toward the transfer position 18, along the reference axis RY for a predetermined distance, so that the substrate 1 assumes a specific position with respect to the transfer position 18 along the reference axis RY (Step ST18). At this time, it suffices to move the substrate 1 for a predetermined distance since the substrate 1 has been properly positioned with respect to the hand 28 during its transfer from the take-up position 16.

The hand 28 is then lowered along the Z axis, so that the substrate 1 is transferred from the hand onto the mount surfaces 20 of the four L-shaped support members 19 forming one set, which define the transfer position 18. This done, the hand 28 is moved from under the substrate 1 (Step ST19).

Thereafter, the transfer mechanism 21 pulls the hand 28 away from the transfer position 18 along the reference axis RY, moving the hand 28 back to the initial position (Step ST20). The control section 41 determines whether the next substrate must be transferred from the cassette 2 to the transfer position 18 (Step S21). If Yes, the apparatus 10 will repeat Steps STI to ST21.

In the above-mentioned method and apparatus for transferring substrates, the non-contact sensors 30a and 30b detects two point on one side of a substrate 1. From the detected positions of these points, the angle at which the substrate 1 is inclined to the reference axis RY and the position which the side takes with respect to the transferring mechanism 21 are calculated and used as first positional data representing the position of the one side of the substrate 1. Further, the third non-contact sensor 30c detects one point on another side of the substrate 1 which is perpendicular to the one side. From the detected position of this point, second positional data is generated which represents the position of the another side of the substrate 1 relative to the transfer mechanism 21. Upon transferring the substrate 1 from the take-up position 16 to the transfer position 18, the transferring mechanism 21 is controlled in accordance with the first and second positional data, so that the substrate 1 can thereby be positioned to the accuracy of ±0.5 mm and then be transferred to the transfer position 18.

Since the substrate 1 need not contact any positioning member to be positioned appropriately, no micro-cracks develop in the substrate or no chipping occurs on the substrate 1. Having no micro-cracks or having not chipped at all, the substrate 10 will hardly be broken when applied with a mechanical load while it is being processed, and no thermal stress will concentrate at any part of the substrate 1 when the substrate is being heated and cooled.

The transferring apparatus 10 requires no positioning mechanism as complex as the one incorporated in the conventional transferring apparatus. The apparatus 10 can therefore be manufactured at a lower cost. The method according to the invention uses no independent mechanical means for positioning the substrate 1. Rather, the position of the substrate 1 is calculated during the transferring process by means of the transferring mechanism 21. Hence, the substrate 1 can be transferred faster than by the conventional method.

In the conventional apparatus and method, to transfer a substrate of a different size, the positioning mechanism must be replaced by another designed to position the substrate. In the apparatus 10 and the method according to the above-mentioned embodiment, however, by controlling the operation of the transferring mechanism 21 by means of the control section 41 in accordance with the size of substrates to be transferred, various substrates can be transferred from the take-up position to the transfer position, regardless of the size of the substrates.

In addition, since the three sensors 30a, 30b and 30c are reflection sensors of on-off type, the apparatus 10 can be more simple and can be made at less cost than otherwise. Furthermore, each sensor can reliably detect the glass substrate 1 because it emits an infrared beam which does not penetrate the glass substrate 1 but is reflected therefrom.

Arranged on the hand 28 of the transferring mechanism 21, the first and second sensors 30a and 30b can detect the position of the substrate 1 as the hand 28 is moved to transfer the substrate 1. In other words, the position of the substrate 1 is detected at the same time the substrate 1 is transferred. The apparatus 10 can therefore transfer the substrate 1 faster than otherwise. All sensors i.e., the sensors 30a, 30b and 30c may be provided on the hand 28 of the transferring mechanism 21.

The present invention is not limited to the embodiment described above. Various changes and modifications can be made, without departing from the scope of the invention. For example, positioning marks may be provided on the lower surface of the substrate 1, and the sensors 30a, 30b and 30c may detect these marks, instead of the sides 1a and 1b of the substrate 1, so as to determine the position of the substrate 1.

Figure 9:
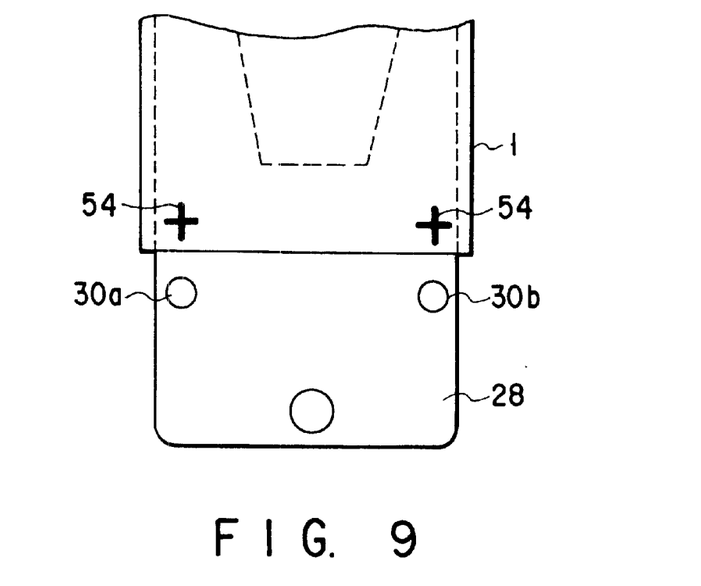
FIG. 9 is a plan view of a substrate which has positioning marks.
Figure 10:
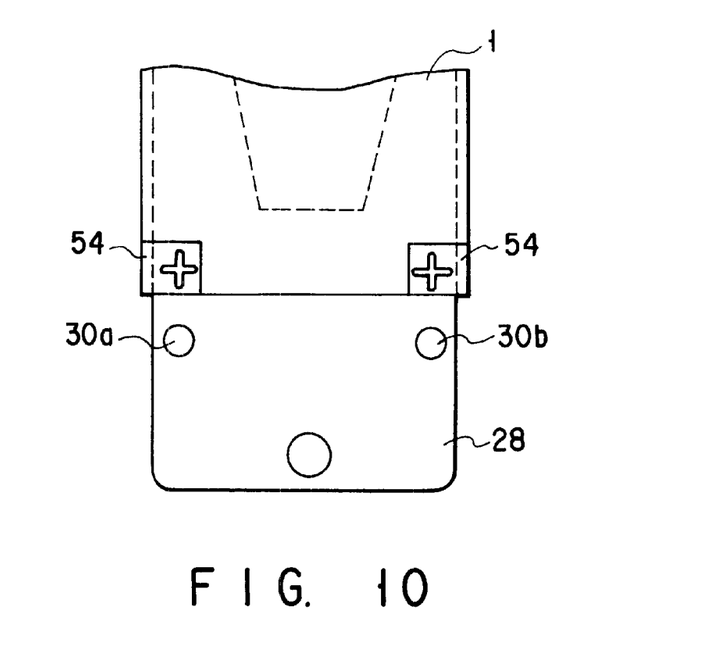
FIG. 10 is a plan view of a substrate which has positioning marks of another type.

The positioning marks may be such cross-shaped ones 54 as shown in FIG. 9. The cross-shaped marks 54 are provided on the two adjacent corners of the substrate 1. The marks 54 are made of thin opaque film of aluminum, aluminum alloy, molybdenum-tantalum alloy or the like. These metals are usually employed as materials of gate lines of liquid crystal displays. The cross-shaped marks 54 can be utilized to position the substrate in any step of manufacturing a liquid crystal display, other than the step of transferring the substrate 1. The positioning marks 54 may be replaced by marks of the type shown in FIG. 10. These marks are made of rectangular thin opaque film of the same material as the marks 54, and each has a cross-shaped through hole.

Moreover, the first to third sensors 30a, 30b and 30c may be provided on the cassette mount section 13 of the main body 12. In this case, the sensors 30a to 30c are repeatedly moved into and pulled form the cassette 2 to detect the positions of the substrates contain in the cassette 2, one after another. Instead, sets of sensors, as many as the substrates 1 contained in the cassette 2, may be provided and moved into and pulled from the spaces among the substrates 1 held one above the other, thereby to detects the positions of the substrates 2 at a time. One or many sets of sensors provided can detect the positions each substrate 1 assume with respect to the X axis and Y axis in the cassette 2, at the same time. Since the position of any substrate 1 is determined before the transferring mechanism 21 is operated, the hand 28 can take an optimal position before it holds and transfer the substrate 1.

Still further, the first to third sensors 30a, 30b and 30c may be arranged between the take-up position 16 and the transfer position 18, to detect the position of a substrate 1 while the transferring mechanism 21 is transferring the substrate 1 from the position 16 to the position 18. In this case, the mechanism 21 can take out the substrate from the cassette, regardless the position of the substrate in the cassette, and transfer the substrate to the transfer position after detecting the position of the taken out substrate.

The transferring mechanism 21 may have four or more non-contact sensors, instead of three sensors 30a to 30c as in the apparatus 10 described above. This would increase the accuracy of determining the position of the substrate 1 and ultimately enhance the reliability of positioning the substrate 1 in the transfer position 18.

The sensors 30a to 30c, all being of non-contact, reflection type, may be replaced by distance sensors which detects the position of a substrate, in the form of coordinate values. Alternatively, they may be replaced by non-optical sensors, such as non-contact, ultrasonic or electromagnetic sensors.

Furthermore, the transferring mechanism 21 may be so designed that the hand 28 can moved along the Y axis only, between the take-up position 16 and the transfer position 18, and the substrate 1 at the take-up position may be positioned with respect to the mechanism 21. In this case, the non-contact sensors 30a to 30c are arranged on the cassette mount section 13 to detect the position of any substrate 1 contained in the cassette 2, and cassette moving means is provided on the cassette mount section 13 to move the cassette 2 along the X, Y and Z axes and rotate the cassette 2 in the direction of the arrow θ. In accordance with the position of the substrate detected by the sensors 30a to 30c, the control section 41 controls the cassette moving means so as to position the substrate at a predetermined position with respect to the transferring mechanism 21. Thus, the transferring mechanism 21 can transfer the positioned substrate from the take-up position to the transfer position.

Alternatively, the mechanism 21 may be so designed that the hand 28 can moved along the Y axis only, between the take-up position 16 and the transfer position 18, and the support members 19 may be movable with respect to the substrate 1 transferred by the mechanism 21 from the take-up position 16. If this is the case, the sensors 30a to 30c can be located anywhere so long as they can detect the position of the substrate 1, and support moving means is provided near the substrate mount section 14 to move the support members 19 along the X, Y and Z axes and rotate the cassette 2 in the direction of the arrow θ. Based on the position the sensors 30a to 30c have detected of the substrate 1, the control section 41 controls the support moving means. Controlled thereby, the support moving means moves the support members 19 until the mount surfaces 20 of the members 19 are properly positioned with respect to the substrate 1 transferred by the mechanism 21 from the take-up position 16. As a result, the substrate 1 is set on the transfer position 18.

The transferring mechanism 21 may be combined with the cassette moving means or the support moving means, or with both means, to move the substrate 1 in the X, Y and Z axes and rotate it in the direction of the arrow θ. Hence, the substrate can be set in the transfer position 18, positioned in a desired manner.

The apparatus according to the present invention is useful particularly when employed to transfer glass substrates in which is likely to have micro-cracks or to be chipped. Nevertheless, the apparatus can attain the same advantage as described above, when it is used to transfer substrates made of plastics.

What is claimed is:

1. An apparatus for transferring a substantially rectangular substrate from a first position to a second position, the apparatus comprising:

a first mount section configured to support a plurality of substantially rectangular substrates, at the first position, in a first direction;

a second mount section configured to support a plurality of substantially rectangular substrates at the second position;

a transferring unit configured to transfer the substrate from the first position of the first mount section to the second position of the second mount section;

a detector configured to detect a position of the substrate in a non-contact manner, and to generate detection signals; and a control unit configured to generate positional data in accordance with the detection signals, and to control the transferring unit in accordance with the positional data so as to transfer the substrate from the first position to the second position, the transferring unit including a hand configured to handle the substrate and movable in the first direction, and the detector including a sensor provided at the hand.

2. An apparatus according to claim 1, wherein the detector includes two sensors provided at the hand and spaced from each other.

3. An apparatus according to claim 1, wherein the transferring unit includes a rotatable shaft and an arm connected to the shaft, and the hand is connected to the arm.

4. An apparatus according to claim 1, wherein the control unit includes a control section configured to generate the positional data in accordance with a positional relationship between the sensor and a side of the substrate.

5. An apparatus according to claim 1, wherein the first mount section includes a cassette mount section defining the first position and configured to hold a cassette at the first position, the cassette containing a plurality of substantially rectangular substrates located one above another at predetermined intervals.

* * * * *